(12) United States Patent
Seo et al.

(10) Patent No.: US 8,368,291 B2
(45) Date of Patent: Feb. 5, 2013

(54) RADIANT HEAT SUBSTRATE AND METHOD FOR MANUFACTURING THE RADIANT HEAT SUBSTRATE, AND LUMINOUS ELEMENT PACKAGE WITH THE RADIANT HEAT SUBSTRATE

(75) Inventors: Ki Ho Seo, Gyeonggi-do (KR); Tae Hoon Kim, Gyeonggi-do (KR); Sang Hyun Shin, Gyeonggi-do (KR); Cheol Ho Heo, Busan (KR); Young Ki Lee, Gyeonggi-do (KR); Ji Hyun Park, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 48 days.

(21) Appl. No.: 12/964,285

(22) Filed: Dec. 9, 2010

(65) Prior Publication Data

US 2012/0043875 A1 Feb. 23, 2012

(30) Foreign Application Priority Data

Aug. 18, 2010 (KR) .................. 10-2010-0079825

(51) Int. Cl.
*H01L 33/64* (2010.01)
*H01L 33/48* (2010.01)
(52) U.S. Cl. ............. 313/45; 313/46; 257/98; 257/99

(58) Field of Classification Search .............. 313/46, 313/45; 362/294
See application file for complete search history.

(56) References Cited

U.S. PATENT DOCUMENTS

| 2004/0041757 A1* | 3/2004 | Yang et al. ............... 345/82 |
| 2005/0068776 A1* | 3/2005 | Ge ........................ 362/296 |
| 2005/0122018 A1* | 6/2005 | Morris .................... 313/46 |

FOREIGN PATENT DOCUMENTS

| JP | 10-154770 | 6/1998 |
| KR | 10-2008-0060737 | 7/2008 |

* cited by examiner

*Primary Examiner* — Karabi Guharay
(74) *Attorney, Agent, or Firm* — McDermott Will & Emery LLP

(57) ABSTRACT

The present invention provides a radiant heat substrate comprising: a conductive substrate which is formed of a metal material and includes a front surface having a luminous element mounted thereon and a rear surface opposed to the front surface; an insulating film which covers the front surface of the conductive substrate; a metal oxide film which covers the rear surface of the conductive substrate; and a metal pattern which covers the insulating film, wherein the metal pattern comprises: a heat transfer pad which is bonded to the luminous element; and a circuit line which is disposed at a region except from the mounting region of the luminous element and is electrically connected to the luminous element.

8 Claims, 9 Drawing Sheets

RADIANT HEAT SUBSTRATE AND METHOD FOR MANUFACTURING THE RADIANT HEAT SUBSTRATE, AND LUMINOUS ELEMENT PACKAGE WITH THE RADIANT HEAT SUBSTRATE

CROSS-REFERENCE(S) TO RELATED APPLICATIONS

This application claims the benefit under 35 U.S.C. Section [120, 119, 119(e)] of Korean Patent Application Serial No. 10-2010-0079825 entitled "Radiant Heat Substrate And Method For Manufacturing The Radiant Heat Substrate, And Luminous Element Package With The Radiant Heat Substrate" filed on Aug. 18, 2010, which is hereby incorporated by reference in its entirety into this application.

BACKGROUND OF THE INVENTION

1. Field of the Invention

The present invention relates to a radiant heat substrate and a luminous element package with the radiant heat substrate; and, more particularly, to a radiant heat substrate for improving radiation efficiency and a method for manufacturing the same, and a luminous element package with the radiant heat substrate.

2. Description of the Related Art

In general, a luminous element package is formed by packaging luminous elements including a Light Emitting Diode (LED) and a Light Emitting Laser to be mounted on electronic devices, remote controls, electronic sign boards, indicators, automatic machine, and lighting systems. As luminous elements have recently been applied to various fields, it is required a package technology for effectively dissipating the heat produced when luminous elements operate. In particular, in case of a high-output LED applied to lighting systems, power consumption is increased and thus high-temperature heat is generated. Therefore, in order to package the high-output LED, a radiant heat substrate to be bonded to the LED is required to have high radiation efficiency.

SUMMARY OF THE INVENTION

The present invention has been proposed in order to overcome the above-described problems and it is, therefore, an object of the present invention to provide a radiant heat substrate with higher radiation efficiency and a luminous element package equipped with the radiant heat substrate.

Further, another object of the present invention is to provide a method for manufacturing a radiant heat substrate for improving radiation efficiency.

In accordance with one aspect of the present invention to achieve the object, there is provided a radiant heat substrate including: a conductive substrate which is formed of a metal material and includes a front surface having a luminous element mounted thereon and a rear surface opposed to the front surface; an insulating film which covers the front surface of the conductive substrate; a metal oxide film which covers the rear surface of the conductive substrate; and a metal pattern which covers the insulating film, wherein the metal pattern includes: a heat transfer pad which is bonded to the luminous element; and a circuit line which is disposed at a region except from the mounting region of the luminous element and is electrically connected to the luminous element.

Also, the metal pattern is formed to further cover the metal oxide film, and the metal oxide film is used as an anti-leakage current film for preventing leakage currents from the conductive substrate to the outside through the metal pattern covering the metal oxide film.

Also, the conductive substrate is formed of an Al material, and the metal oxide film includes Al2O3 layer.

Also, the metal pattern is formed of a Cu material.

Also, the insulating film is formed of a resin.

In accordance with other aspect of the present invention to achieve the object, there is provided a luminous element package including: a luminous element; a conductive substrate which is formed of a metal material and includes a front surface having the luminous element mounted thereon and a rear surface opposed to the front surface; an insulating film which covers the front surface of the conductive substrate; a metal oxide film which covers the rear surface of the conductive substrate; and a metal pattern which covers the insulating film, wherein the metal pattern comprises: a heat transfer pad which is disposed on the front surface and is bonded to the luminous element; and a circuit line which is disposed at a region except for the mounting region of the luminous element and is electrically connected to the luminous element.

Also, the metal pattern is formed to further cover the metal oxide film, and the metal oxide film is used as an anti-leakage current film for preventing leakage currents from the conductive substrate to the outside through the metal pattern covering the metal oxide film.

Also, the conductive substrate is formed of an Al material, the metal oxide film includes an Al2O3 layer, and the metal pattern is formed of a Cu material.

In accordance with other aspect of the present invention to achieve the object, there is provided a method for manufacturing a radiant heat substrate including the steps of: preparing a conductive substrate which is formed of a metal material and includes a front surface having a luminous element mounted thereon and a rear surface opposed to the front surface; forming an insulating film on the front surface of the conductive substrate; forming a metal oxide film on the rear surface of the conductive substrate; and forming a metal pattern covering the insulating film, wherein the step of forming the metal pattern comprises the steps of: forming a heat transfer pad at a region where the luminous element is mounted; and forming a circuit line which is disposed at a region except for the mounting region of the luminous element and is electrically connected to the luminous element.

Also, the step of forming the metal pattern includes the steps of: forming a seed layer which covers the insulating film; forming a plating film on the insulating film by performing a plating process where the seed layer is used as a seed; and removing a part of the plating film.

Also, the step of forming the heat transfer pad and the step of forming the circuit line are performed at the same time.

Also, the step of preparing the conductive substrate comprises a step of preparing an Al metal plate, and the step of forming the metal oxide film includes a step of forming an Al2O3 layer by anodizing the Al metal plate.

In accordance with other aspect of the present invention to achieve the object, there is provided a radiant heat substrate including: a conductive substrate which is formed of a metal material and includes a front surface having a luminous element mounted thereon, a rear surface opposed to the front surface, and a through hole formed at a region where the luminous element is mounted; a metal oxide film which covers the front and rear surfaces, and a surface of the through hole of the conductive substrate in a conformal manner; a heat transfer via which fills the through hole through interposition of the metal oxide film; and a metal pattern which covers the metal oxide film formed on the front surface, wherein the metal pattern comprises: a heat transfer pad which is bonded to the luminous element; and a circuit line which is disposed at a region except for the mounting region of the luminous element and is electrically connected to the luminous element.

Also, the metal pattern is formed to further cover the rear surface of the conductive substrate, and the heat transfer via has one end which is connected to the heat transfer pad, and the other end which is connected to the metal pattern formed on the rear surface.

Also, the metal pattern further covers the rear surface of the conductive substrate, and the metal oxide film is used as an anti-leakage current film for preventing the leakage currents from the conductive substrate to the outside through the metal pattern formed on the rear surface.

Also, the conductive substrate is formed of an Al material, the metal oxide film includes an Al2O3 layer, and the metal pattern is formed of a Cu material.

Also, the heat transfer via has a hollow structure, and the radiant heat substrate further includes a filler for filling a vacant space inside the heat transfer via.

In accordance with other aspect of the present invention to achieve the object, there is provided a luminous element package including: a luminous element; a conductive substrate which is formed of a metal material and includes a front surface having the luminous element mounted thereon and a rear surface opposed to the front surface, and a through hole formed on a region where the luminous element is mounted; a metal oxide film which covers the front and rear surfaces, and the through hole of the conductive substrate; a heat transfer via which fills the through hole by interposition of the metal oxide film; and a metal pattern which covers the metal oxide film formed on the front surface, wherein the metal pattern comprises: a heat transfer pad which is bonded to the luminous element; and a circuit line which is disposed at a region except for the mounting region of the luminous element and is electrically connected to the luminous element.

Also, the metal pattern further covers the rear surface of the conductive substrate, and the heat transfer via has one end which is connected to the heat transfer pad, and the other end which is connected to the metal pattern formed on the rear surface.

Also, the metal pattern is formed to further cover the metal oxide film, and the metal oxide film is used as an anti-leakage current film for preventing leakage currents from the conductive substrate to the outside through the metal pattern covering the metal oxide film.

Also, the conductive substrate is formed of an Al material, the metal oxide film includes an Al2O3 layer, and the metal pattern is formed of a Cu material.

Also, the heat transfer via has a hollow structure, and the radiant heat substrate further includes a filler for filling a vacant space inside the heat transfer via.

In accordance with other aspect of the present invention to achieve the object, there is provided a method for manufacturing a radiant heat substrate including the steps of: preparing a conductive substrate which is formed of a metal material and has a front surface and a rear surface opposed to the front surface; forming a through hole of the conductive substrate; forming a metal oxide film to cover the front and rear surfaces, and the surface of the through hole of the conductive substrate in a conformal manner; and forming a metal pattern covering the front and rear surfaces of the conductive substrate, wherein the step of forming the metal pattern comprises the steps of: forming a heat transfer pad at a region where the luminous element is mounted; and forming a circuit line which is disposed at a region except for the mounting region of the luminous element and is electrically connected to the luminous element.

Also, the step of forming the heat transfer pad and the step of forming the circuit line are performed at the same time.

Also, the step of preparing the conductive substrate includes a step of preparing an Al metal plate, and the step of forming the metal oxide film includes a step of forming an Al2O3 layer by anodizing the Al metal plate.

Also, the step of forming the metal pattern includes the steps of: forming a seed layer which covers the front and rear surfaces, and the through hole; forming a plating film which covers the front and rear surfaces while filling the through hole, by performing a plating process where the seed layer is used as a seed; and removing a part of the plating film formed on the front surface of the conductive substrate.

Also, the step of forming the plating film includes a step of forming the heat transfer via with a hollow structure formed in the through hole, and the method for manufacturing the radiant heat substrate further comprises a step of filling a vacant space inside the heat transfer via with the filler.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Hereinafter, a radiant heat substrate, a method for manufacturing the radiant heat substrate, and a luminous element package with the radiant heat substrate according to embodiments of the present invention will be described in more detail with reference to the accompanying drawings.

Figure 1:
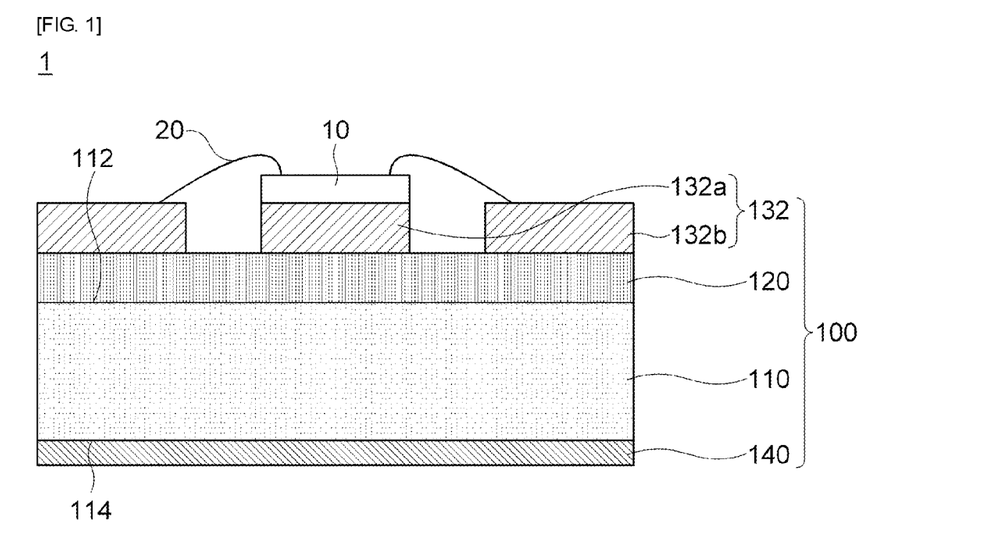
FIG. 1 is a view showing a radiant heat substrate in accordance with one embodiment of the present invention.

FIG. 1 is a view showing a luminous element package including a radiant heat substrate in accordance with one embodiment of the present invention. Referring to FIG. 1, the luminous element package 1 according to one embodiment of the present invention may include a luminous element 10 and a radiant heat substrate 100 which are bonded to each other.

The luminous element 10 may include at least one of an LED and a laser diode. The luminous element 10 may be electrically connected to the radiant heat substrate 100 by a connection means 20. A bonding wire may be used as the connection means 20.

The radiant heat substrate 100 may emit heat, produced from the luminous element 10, to the outside. In addition, the radiant heat substrate 100 may be a package structure provided for mounting of the luminous element 10 on an external electronic device (not shown). For one example, the radiant heat substrate 100 may include a conductive substrate 110, an insulating film 120, and a metal pattern 132, and a protective film 140.

The conductive substrate 110 may be a plate made up of a conductive material with high heat conductivity. For example, the conductive substrate 110 may be a metal substrate formed of various kinds of metal materials. For one example, the radiant heat substrate 100 may be an Al substrate.

The insulating film 120 may cover the front surface 112 of the conductive substrate 110 on which the luminous element 10 is mounted. The insulating film 120 may be a thin-film formed of various kinds of resins.

The metal pattern 132 may be provided on the insulating film 120. The metal pattern 132 may include a first pattern 132a and a second pattern 132b. The first pattern 132a may be interposed between the luminous element 10 and the conductive substrate 110. The first pattern 132a may be a heat transfer pad for transferring the heat produced from the luminous element 10 to the conductive substrate 110. The second pattern 132b may be a circuit line which is electrically connected to the luminous element 10 by the connection means 20.

The protective film 140 may cover the rear surface 114 of the conductive substrate 110. The protective film 140 may be a metal oxide film. For example, the protective film 140 may be an $Al_2O_3$ layer formed by anodizing the conductive substrate 110. The protective film 140 may be used as an anti-leakage current film for preventing currents leaking from the conductive substrate 110 to the outside.

The luminous element package 1 may have a structure where heat produced from the luminous element 10 is transferred to the conductive substrate 110 through the first pattern 132a of being a heat transfer pad and the transferred heat is emitted to the outside. Thus, the luminous element package 1 is structured to have a conductive substrate 110 formed of a conductive material with high heat conductivity, so that it is possible to transfer the heat produced from the luminous element 10 to the conductive substrate 110 through the heat transfer pad (i.e., first pattern 132a) and then to emit the heat to the outside, which results in an increase of radiation efficiency.

Also, the luminous element package 1 may protect the rear surface 114 of the conductive substrate 110 by using the protective film 140 like a metal oxide film. In this case, when the luminous element package 1 is to be combined with a metal chassis (not shown), currents leaking from the conductive substrate 110 to the metal chassis may be blocked by the protective film 140. Thus, the luminous element package 1 can prevent leakage currents from the conductive substrate 110 to the metal chassis, thereby implementing a structure for preventing deterioration of electrical characteristics due to the leakage currents.

Continuously, a detailed description will be given of a process of manufacturing the radiant heat substrate 100 in accordance with one embodiment of the present invention. Herein, the repeated description thereof will be omitted or simplified.

Figure 2A:
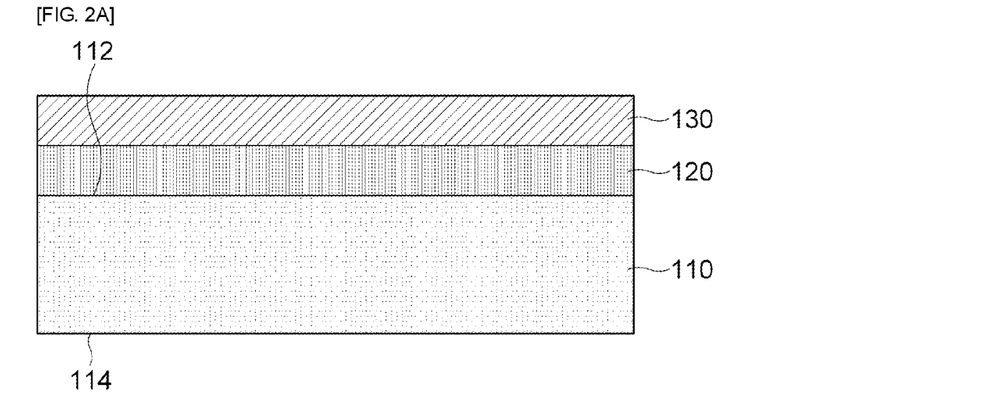
FIGS. 2A to 2C are views for explaining a process of manufacturing a radiant heat substrate in accordance with one embodiment of the present invention, respectively.
Figure 2B:
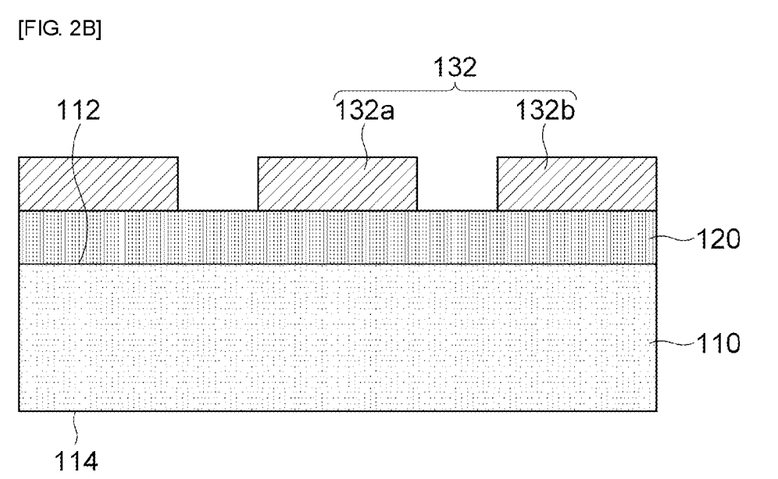
Figure 2C:
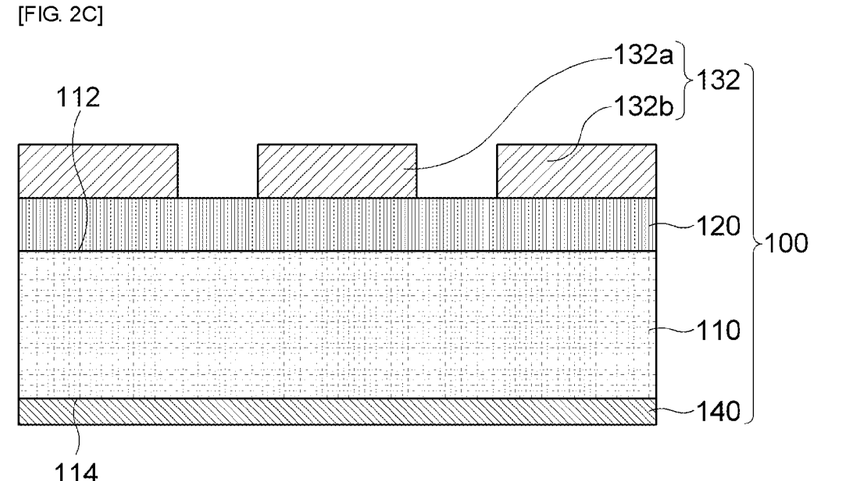

FIGS. 2A to 2C are views for explaining a process for manufacturing the radiant heat substrate in accordance with one embodiment of the present invention, respectively.

Referring to FIG. 2A, there may be prepared a conductive substrate 110 which includes a front surface 112 and a rear surface 114 opposed to the front surface 112. As for the conductive substrate 110, an Al thin-film may be used.

The insulating film 120 may be formed on the conductive substrate 110. For one example, the step of forming the insulating film 120 may be made by attaching an insulating film, formed of a resin material, on the front surface 112 of the conductive substrate 110. For another example, the step of forming the insulating film 120 may be made by coating an insulating composition of a silicon material on the front surface 112 of the conductive substrate 110.

The metal film 130 may be formed on the insulating film 120. The step of forming the metal film 130 may include a step of forming a copper layer on the insulating film 120. The step of forming the copper layer may include the steps of forming a seed layer on the insulating film 120, and performing a plating process where the seed layer is used as a seed. Thus, the metal film 130 of being a plating film with copper may be formed on the insulating film 120.

Referring to FIG. 2B, the metal pattern 132 may be formed on the conductive substrate 110. The step of forming the first pattern 132a may include a step of forming both the first and second patterns 132a and 132b by partially removing the metal film (indicated by reference numeral 130 of FIG. 2A) formed on the front surface of the conductive substrate 110. The step of partially removing the metal film 130 may be made by various kinds of etching and laser processing processes.

Referring to FIG. 2C, the protective film 140 may be formed on the conductive substrate 110. The step of forming the protective film 140 may include a step of selectively forming the metal oxide film on the rear surface 114 of the conductive substrate 110 by anodizing the conductive substrate 110. At this time, in case where the conductive substrate 110 is an Al substrate, the metal oxide film formed on the conductive substrate 110 may be an $Al_2O_3$ layer. Thus, the radiant heat substrate 100 shown in FIG. 1 may be manufactured.

Meanwhile, after the radiant heat substrate 100 is manufactured in this manner, the luminous element 10 is mounted on the first pattern 132a of the metal pattern 132, and the luminous element 10 having the first pattern 132a is electrically connected to the second pattern 132b by the connection means 20 of being a bonding wire, so that the luminous element package 1 shown in FIG. 1 may be manufactured.

As described above, in the method for manufacturing the radiant heat substrate according to one embodiment of the present invention, the first pattern 132a which receives the heat produced from the luminous element 10 is formed on the front surface 112 of the conductive substrate 110, and the protective film 140 for preventing leakage currents from the conductive substrate 110 to an external metal chassis (not shown) is formed on the rear surface 114, so that it is possible to manufacture the radiant heat substrate 100 according to one embodiment of the present invention. Thus, according to the method for manufacturing the radiant heat substrate, it is possible to provide the radiant heat substrate 100 with a structure for increasing radiation efficiency and for preventing deterioration of electrical characteristics.

Hereinafter, a detailed description will be given of a modified example of the luminous element package in accordance with one embodiment of the present invention.

Figure 3:
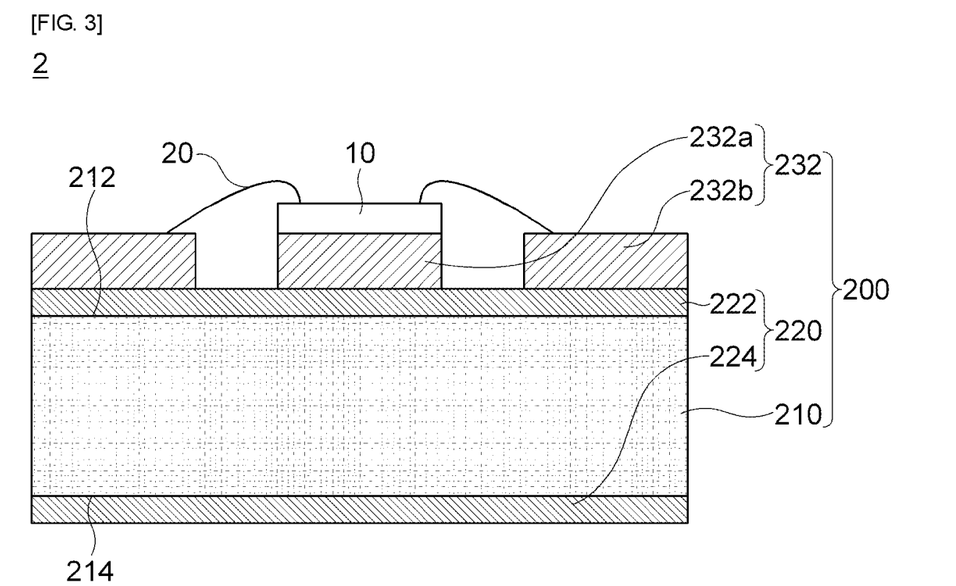
FIG. 3 is a view showing a modified example of a radiant heat substrate in accordance with one embodiment of the present invention.

FIG. 3 is a view showing a modified example of the radiant heat substrate in accordance with one embodiment of the present invention. Referring to FIG. 3, the luminous element package 2 according to the modified example of the present invention may include a luminous element 10 and a radiant heat substrate 200 which are bonded to each other. The luminous element 10 may be electrically connected to the radiant heat substrate 200 by the connection means 20 like a bonding wire. The radiant heat substrate 200 may be a package structure which is provided for emitting the heat produced from the luminous element 10 to the outside, and for mounting the luminous element 10 on an external electronic device (not shown).

The radiant heat substrate 200 may include a conductive substrate 210, a protective film 220, and a metal pattern 232.

The conductive substrate 210 may be a metal substrate formed of various kinds of metal materials. For one example, the conductive substrate 210 may be an Al substrate.

The protective film 220 may include a first protective film 222 and a second protective film 224. The first protective film 222 covers the front surface 212 of the conductive substrate 210 facing the luminous element 10, and the second protective film 224 covers the rear surface 214 opposed to the front surface 212. The first and second protective films 222 and 224 may be insulating films identical to each other. For one example, the first and second protective films 222 and 224 may be metal oxide films formed by anodizing the conductive substrate 210. Therefore, in case where the conductive substrate 210 is an Al substrate, the protective film 220 may be an Al oxide film. The protective film 220 may be used an anti-leakage current film for preventing leakage currents from the conductive substrate 210 to the outside.

The metal pattern 232 may be provided on the front surface 212 of the conductive substrate 210. The metal pattern 232 may include a first pattern 232a and a second pattern 232b. The first pattern 232a may be interposed between the luminous element 10 and the conductive substrate 210. The first pattern 232a may be used as a heat transfer pad for transferring the heat produced from the luminous element 10 to the conductive substrate 210. The second pattern 232b may be a circuit line which is electrically connected to the luminous element 10 by the connection means 20.

The luminous element package 2 may have a structure where both surfaces 212 and 214 of the conductive substrate 210 formed of the metal material with high heat conductivity are covered by the protective film 220 like a metal oxide film.

In this case, when the luminous element package 2 is to be combined with the metal chassis (not shown), currents leaking from the conductive substrate 210 to the metal chassis may be blocked by the protective film 220.

Thus, the luminous element package 2 according to the modified example of the present invention can prevent leakage currents from the conductive substrate 210 to the metal chassis, thereby providing a structure where it is possible to prevent a reduction of electrical characteristics.

Continuously, a detailed description will be given of a process of manufacturing the radiant heat substrate according to a modified example of the present invention. Herein, the repeated description of the above-described radiant heat substrate 200 will be omitted or simplified.

Figure 4A:
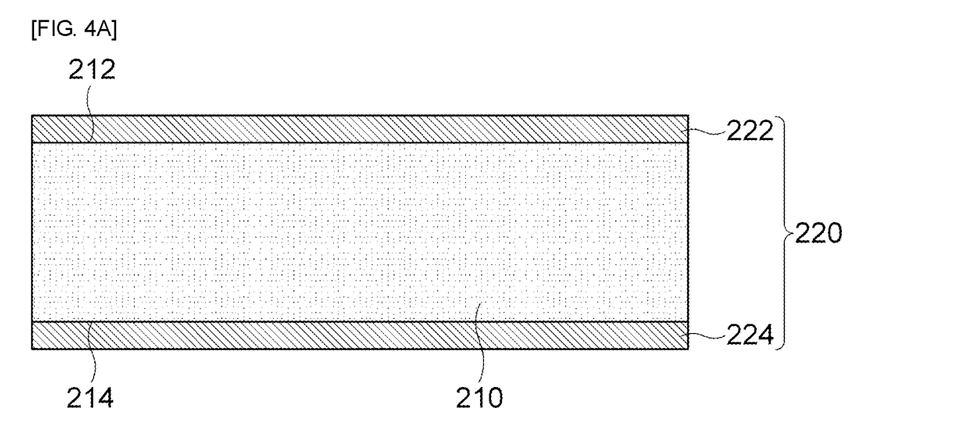
FIGS. 4A to 4C are views for explaining a process of manufacturing the radiant heat substrate shown in FIG. 3, respectively.
Figure 4B:
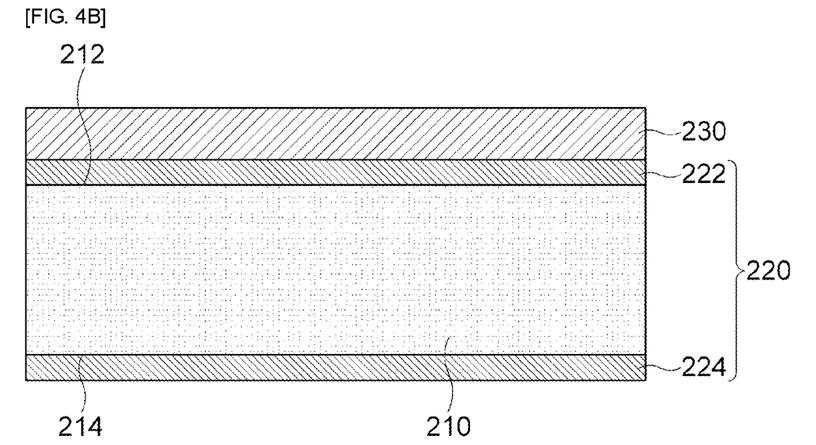
Figure 4C:
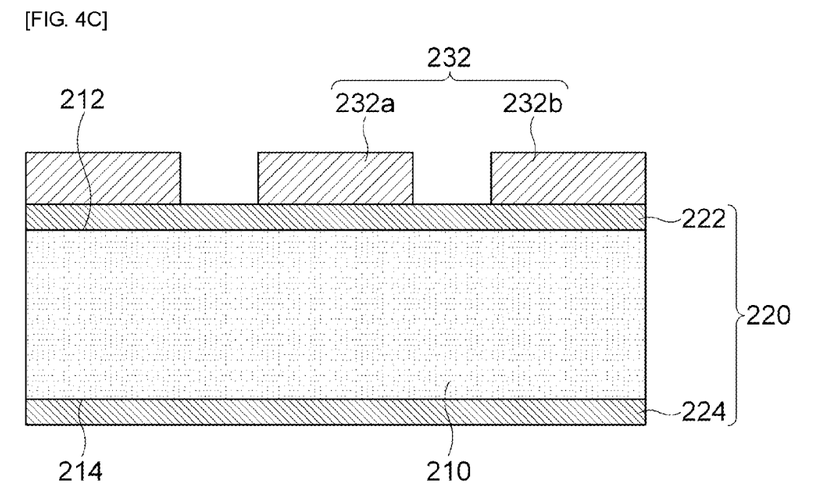

FIGS. 4A to 4C are views for explaining a process of manufacturing the radiant heat substrate shown in FIG. 3, respectively.

Referring to FIG. 4A, there may be prepared a conductive substrate 210 which includes a front surface 212 and a rear surface 214 opposed to the front surface 212. An Al substrate may be prepared as the conductive substrate 210.

The protective film 220 may be formed on the conductive substrate 210. The step of forming the protective film 220 may include a step of forming a metal oxide film on both surfaces 212 and 214 of the conductive substrate 210 by anodizing the conductive substrate 210. Thus, the first protective film 222 may be formed on the front surface 212 of the conductive substrate 210 and the second protective film 224 may be formed on the rear surface 214. At this time, in case where the conductive substrate 210 is an Al substrate, the metal oxide film formed on the conductive substrate 210 may be an $Al_2O_3$ layer.

Referring to FIGS. 4B and 4C, the metal pattern 232 may be formed on the conductive substrate 210. For example, the metal film 230 may be formed on the front surface 212 of the conductive substrate 210. The metal film 230 may be a copper layer. The step of forming the copper layer may include the steps of forming a seed layer on the front surface 212 of the conductive substrate 210 and performing a plating process where the seed layer is used as a seed.

And, the first pattern 232a and the second pattern 232b may be formed by partially removing the metal film 230. The step of partially removing the metal film 130 may be made by performing various kinds of etching and laser processing processes. Thus, the radiant heat substrate 200 shown in FIG. 3 may be manufactured.

Meanwhile, after the radiant heat substrate 200 is manufactured in this way, the luminous element 10 is mounted on the first pattern 232a of the metal pattern 232, and the luminous element 10 is electrically connected to the second pattern 232b by the connection means 20 like the bonding wire, so that the luminous element package 2 shown in FIG. 3 may be manufactured.

As described above, in the method for manufacturing the radiant heat substrate in accordance with another embodiment of the present invention, the first pattern 232a which receives the heat produced from the luminous element 10 is formed on the front surface 212 of the conductive substrate 210, and the protective film 220 for preventing currents leaking from the conductive substrate 210 to the external metal chassis (not shown) is formed on both the front surface 212 and the rear surface 214, so that it is possible to manufacture the radiant heat substrate according to another embodiment of the present invention. Thus, in the method for manufacturing the radiant heat substrate according to the present invention, it is possible to manufacture a radiant heat substrate which implements high radiation efficiency and prevents a reduction of electrical characteristics.

Hereinafter, a detailed description will be given of a luminous element package in accordance with another embodiment of the present invention.

Figure 5:
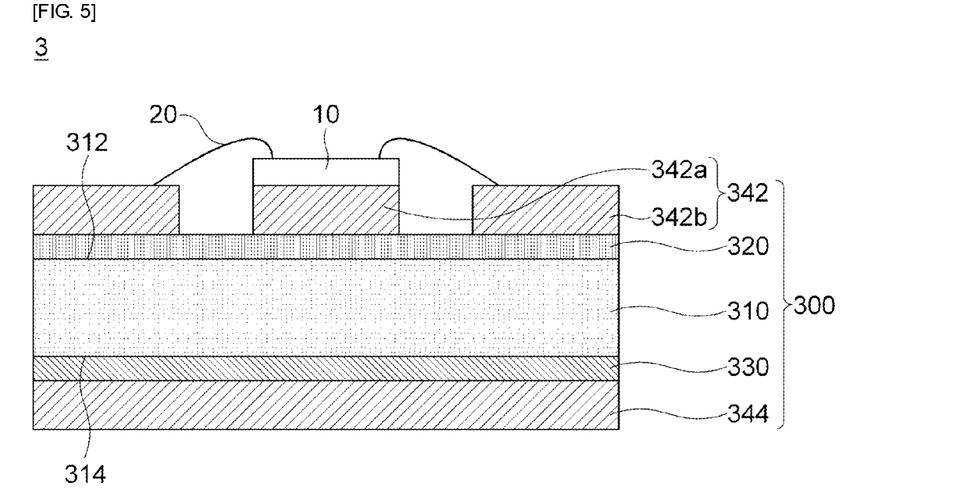
FIG. 5 is a view showing a radiant heat substrate in accordance with another embodiment of the present invention.

FIG. 5 is a view showing a radiant heat substrate in accordance with another embodiment of the present invention. Referring to FIG. 5, the radiant heat substrate in accordance with another embodiment of the present invention may include a luminous element 10 and a radiant heat substrate 300 which are bonded to each other. The luminous element 10 may be electrically connected to the radiant heat substrate 300 by the connection means 20 like a bonding wire. The radiant heat substrate 300 may be a package structure which is for emitting the heat produced from the luminous element 10 to the outside, and for mounting the luminous element 10 on an external electronic device (not shown).

The radiant heat substrate 300 may include a conductive substrate 310, an insulating film 320, a protective film 330, and a metal pattern.

The conductive substrate 310 may be a metal substrate formed of various kinds of metal materials. For one example, the conductive substrate 310 may be an Al substrate.

The insulating film 320 may cover the front surface 312 of the conductive substrate 310 facing the luminous element 10. The insulating film 320 may be a thin-film formed of various kinds of resins.

The protective film 330 may cover the rear surface 314 of the conductive substrate 310. The protective film 330 may be an $Al_2O_3$ layer formed by anodizing the conductive substrate 310. The protective film 330 may be used as an anti-leakage current film for preventing leakage currents from the conductive substrate 310 to the outside.

The metal pattern may include a first metal pattern 330 and a second metal pattern 340. The first metal pattern 330 may cover the insulating film 320, and the second metal pattern 340 may cover the protective film 330. The first metal pattern 330 may include a first pattern 342a and a second pattern 342b. The first pattern 342a may be interposed between the luminous element 10 and the conductive substrate 310 and it may be used as a heat transfer pad for transferring the heat produced from the luminous element 10 to the conductive substrate 110. The second pattern 342b may be a circuit line which is electrically connected to the luminous element 10 by the connection means 20.

The second metal pattern 340 may be formed to cover the protective film 330 formed on the rear surface 314 of the conductive substrate 310. The second metal pattern 340 may be a construction for emitting the heat of the conductive substrate 310 to the outside. To this end, the second metal pattern 340 may be formed of a material with high heat conductivity. For one example, the second metal pattern 340 may be a copper layer.

The luminous element package 3 may have a structure where the heat produced from the luminous element 10 is transferred to the conductive substrate 310 by the first pattern 332a of being a heat transfer pad and the transferred heat is emitted to the outside by the second metal pattern 340. Thus, the luminous element package 3 of the present invention is structured to effectively emit the heat produced from the luminous element 10 to the outside, thereby increasing radiation efficiency.

Also, the luminous element package 3 may have a structure where the front surface 312 of the conductive substrate 310 is covered by the insulating film 320 and the rear surface 314 is covered by the protective film 330. In this case, when the luminous element package 3 is to be combined with a metal chassis, currents leaking from the conductive substrate 310 to the metal chassis may be blocked by the protective film 330. Thus, the luminous element package 3 in accordance with another embodiment of the present invention can prevent leakage currents from the conductive substrate 310 to the metal chassis, thereby implementing a structure for preventing deterioration of electrical characteristics due to leakage currents.

Continuously, a detailed description will be given of a process of manufacturing the radiant heat substrate in accordance with embodiment of the present invention. Herein, the repeated description for the above-described radiant heat substrate 300 will be omitted or simplified.

Figure 6A:
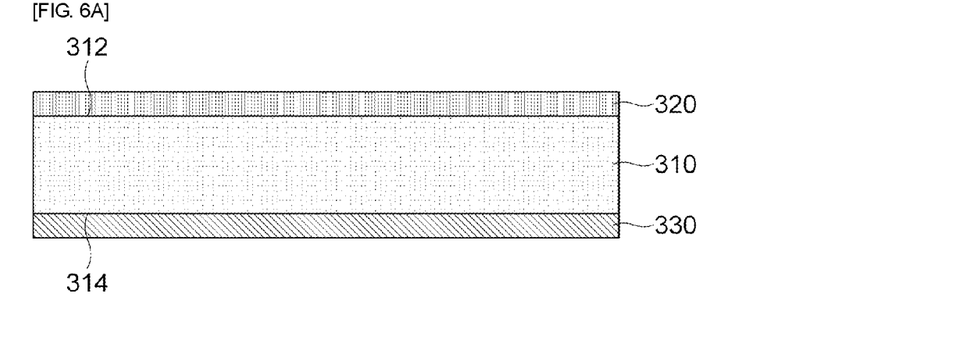
FIGS. 6A to 6C are views for explaining a process of manufacturing a radiant heat substrate in accordance with another embodiment of the present invention, respectively.
Figure 6B:
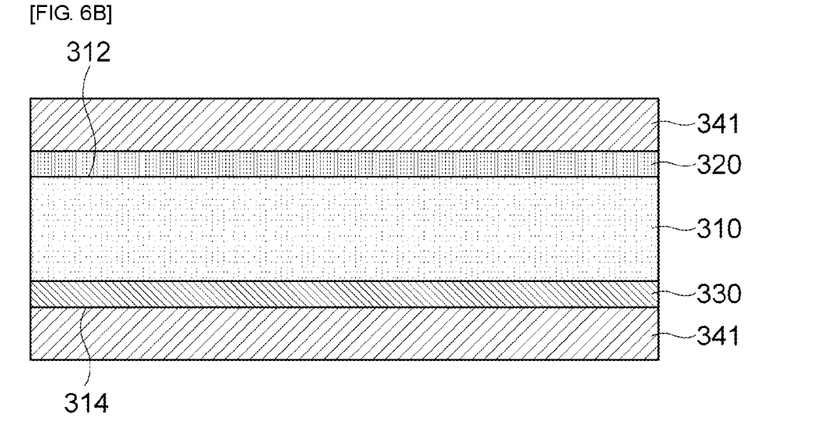
Figure 6C:
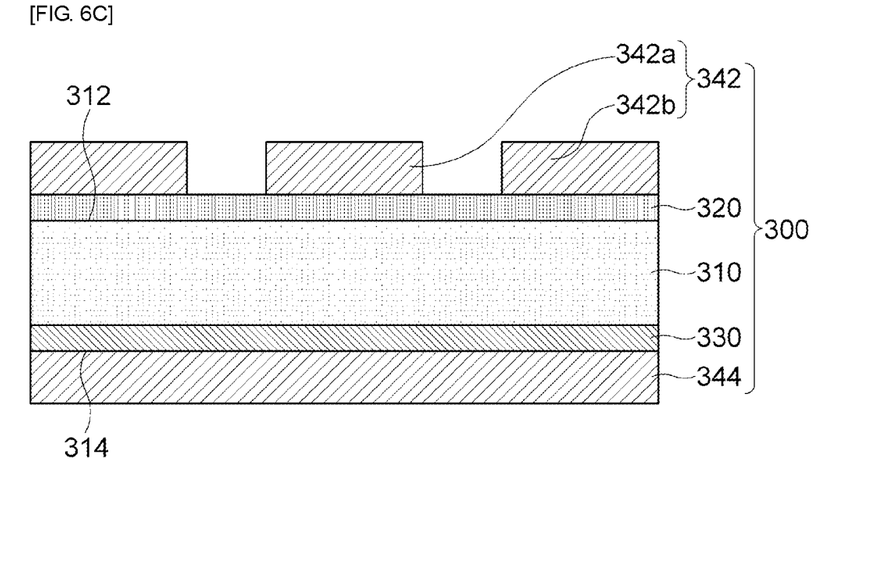

FIGS. 6A to 6C are views for explaining a process of manufacturing a radiant heat substrate in accordance with other embodiment of the present invention, respectively.

Referring to FIG. 6A, there may be prepared a conductive substrate 310 which includes a front surface 312 and the rear surface 314 opposed to the front surface 312. As for the conductive substrate 310, an Al substrate may be prepared.

An insulating film 320 may be formed on the conductive substrate 310. For one example, the step of forming the insulating film 320 may be made by attaching a film formed of a resin on the front surface 312. For another example, the step of forming the insulating film 320 may be made by coating an insulating composition of a silicon material on the front surface 312 of the conductive substrate 310.

And, the first metal pattern 330 may be formed on the rear surface 314 of the conductive substrate 310. The step of forming the first metal pattern 330 may include a step of selectively forming the metal oxide film on the rear surface 314 of the conductive substrate 310 by anodizing the conductive substrate 310. In case where the conductive substrate 310 is an Al substrate, an $Al_2O_3$ layer may be formed on the rear surface 314. Herein, the insulating film 320 may be used as an anti-formation film for preventing the formation of the metal oxide film on the front surface 312 of the conductive substrate 310 in the course of performing the anodizing process. Thus, the front surface 312 of the conductive substrate 310 may have no protective film 330 formed thereon.

Referring to FIG. 6B, the metal film 341 may be formed on the conductive substrate 310. For example, the step of forming the metal film 341 may include a step of forming a copper layer on the conductive substrate 310. The step of forming the copper layer may include the steps of forming seed layers on the both surfaces 312 and 314 of the conductive substrate 310 and performing the plating process where the seed layers are used as seeds to thereby form plating films on the both surfaces 312 and 314 of the conductive substrate 310.

Referring to FIG. 6C, the metal pattern may be formed on the conductive substrate 310. The step of forming the metal pattern may include a step of partially removing the metal film (indicated by reference numeral 341 of FIG. 4B). The step of partially removing the metal film 341 may be made by performing various kinds of etching and laser processing processes for the metal film 341 which covers the front surface 312 of the conductive substrate 310. Thus, the fist metal pattern 342 comprised of the first pattern 342a and the second pattern 342b may be formed on the front surface 312 of the conductive substrate 310, and the second metal pattern 344 for covering the protective film 330 at a uniform thickness may be formed on the rear surface 314 of the conductive substrate 310. Thus, the radiant heat substrate 300 shown in FIG. 5 may be manufactured.

Meanwhile, after the radiant heat substrate 300 is manufactured in this manner, the luminous element 10 is mounted on the first pattern 342a of the first metal pattern 342 and the luminous element with the first pattern 342a is electrically connected to the second pattern 342b by the connection means 20 like a bonding wire, so that the luminous element package 3 shown in FIG. 5 may be manufactured.

As described above, the method for manufacturing the radiant heat substrate in accordance with another embodiment of the present invention may include the steps of forming the first pattern 342a which receives the heat produced from the luminous element 10 on the front surface 312 of the conductive substrate 310, and forming the insulating film 320 and the protective film 330 for protecting leakage currents from the conductive substrate 310 to the metal chassis (not shown) on the front surface 312 and the rear surface 314, respectively. Thus, in the method for manufacturing the radiant heat substrate of the present invention, it is possible to implement high radiation efficiency and to prevent deterioration of electrical characteristics.

Hereinafter, a detailed description will be given of a luminous element package 4 in accordance with the other embodiment of the present invention.

Figure 7:
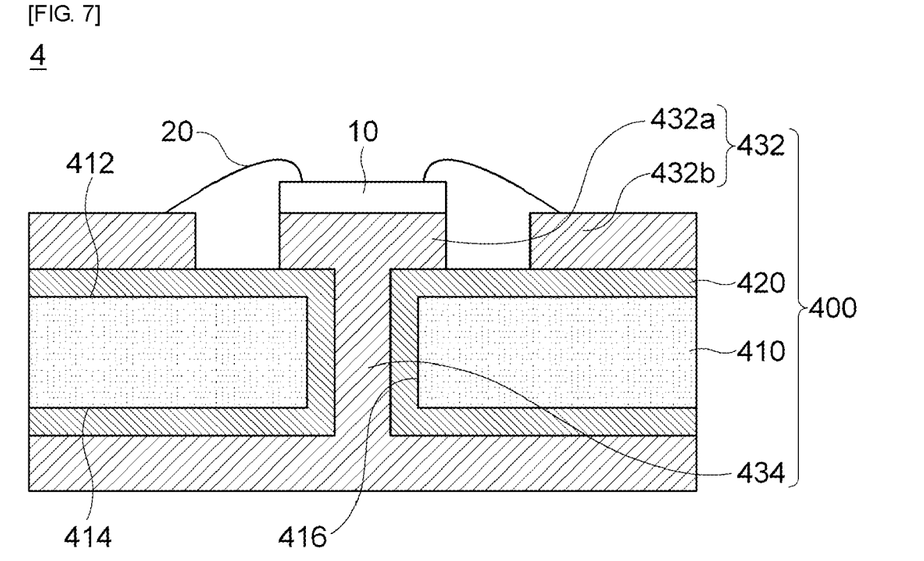
FIG. 7 is a view showing a radiant heat substrate in accordance the other embodiment of the present invention.

FIG. 7 is a view showing the radiant heat substrate in accordance with the other embodiment of the present invention. Referring to FIG. 7, the luminous element package 4 according to the other embodiment of the present invention may include a luminous element 10 and a radiant heat substrate 400 which are bonded to each other. The luminous element 10 may be electrically connected to the radiant heat substrate 400 by the connection means 20 like the bonding wire.

The radiant heat substrate 400 may be a package structure which is provided for emitting the heat produced from the luminous element 10 to the outside and for mounting the luminous element 10 on the external electronic device (not shown). For one example, the radiant heat substrate 400 may include a conductive substrate 410, a protective film 420, a metal pattern 432, and a heat transfer via 434.

The conductive substrate 410 may be a metal substrate which includes a front surface 412 and a rear surface 414 opposed to the front surface 412. For one example, the conductive substrate 410 may be an Al substrate. The conductive substrate 410 may be provided with a through hole 416 at a region where the luminous element 10 is mounted. The through hole 416 may be a Plating Through Hole (PTH) which vertically passes through the front surface 412 and the rear surface 414.

The protective film 420 may be formed to cover the surface of the conductive substrate 410. For example, the protective film 420 may be formed to cover the front surface 412, the rear surface 414, and the through hole 416 of the conductive substrate 410 at a uniform thickness. The protective film 420 may be an $Al_2O_3$ layer formed by anodizing the conductive substrate 410.

The metal pattern 432 may be formed to cover the front surface 412 and the rear surface 414 of the conductive substrate 410. For example, the metal pattern 432 covering the front surface 412 may be constituted by the first pattern 432a and the second pattern 432b. The first pattern 432a may be interposed between the luminous element 10 and the conductive substrate 410 and thus it may be used as a heat transfer pad for transferring the heat produced from the luminous element 10 to the conductive substrate 410. The second pattern 432b may be a circuit line which is electrically connected to the luminous element 10 by the connection means 20. Also, the metal pattern 432 may be formed to cover the rear surface 414 of the conductive substrate 410 at a uniform thickness. The metal pattern 432 with the above-described structure may be a construction for emitting the heat of the conductive substrate 410 to the outside. To this end, preferably, the metal pattern 432 may be formed of a material with high heat conductivity. For one example, the metal pattern 432 may be formed with a copper layer.

The heat transfer via 434 may be formed to fill the through hole 416 of the conductive substrate 410. In addition, the heat transfer via 434 may have one end connected to the first pattern 432a and the other end connected to the metal pattern 432. Herein, the heat transfer via 434 and the metal pattern 432 covering the first pattern 432a and the rear surface 414 may be formed in a body, and there may exist no boundary surface therebetween. Meanwhile, the heat transfer via 434 may be formed of a material with high heat conductivity. For one example, the heat transfer via 434 may be provided as a conductive via including copper. In this case, the heat transfer via 434 may be used as a radiation means for emitting the heat produced from the luminous element 10 to the outside, together with the metal pattern 432.

Also, the luminous element package 4 may have a structure where the heat produced from the luminous element 10 is transferred to the heat transfer via 434 through the first pattern 432a of being a heat transfer pad and the transferred heat is emitted to the outside. Herein, the heat transfer via 434 may have one end which is directly connected to the heat transfer via 434, and the other end which is directly connected to the metal pattern 432 covering the rear surface 414, so that it is possible to effectively emit the heat of the luminous element 10 to the outside. Thus, the luminous element package 4 may be structured to effectively emit the heat produced from the luminous element 10 to the outside, thereby increasing radiation efficiency.

Also, the luminous element package 4 may have a structure where the both surfaces 412 and 414 of the conductive substrate 410 are covered by the protective film 420 of being a metal oxide film. In this case, when the luminous element package 4 is to be combined with the metal chassis (not shown), currents leaking from the conductive substrate 410 to the metal chassis may be blocked by the protective film 420. Thus, the luminous element package 4 according to the other embodiment of the present invention can prevent leakage currents from the conductive substrate 410 to the metal chassis, thereby implementing a structure where electrical characteristics are lowered due to the leaked currents.

Continuously, a detailed description will be given of a process of manufacturing the radiant heat substrate in accordance with the other embodiment of the present invention. Herein, the repeated description of the above-mentioned radiant heat substrate 400 will be omitted or simplified.

FIGS. 8A to 8D are views for explaining a process of manufacturing the radiant heat substrate in accordance with the other embodiment of the present invention, respectively.

Figure 8A:
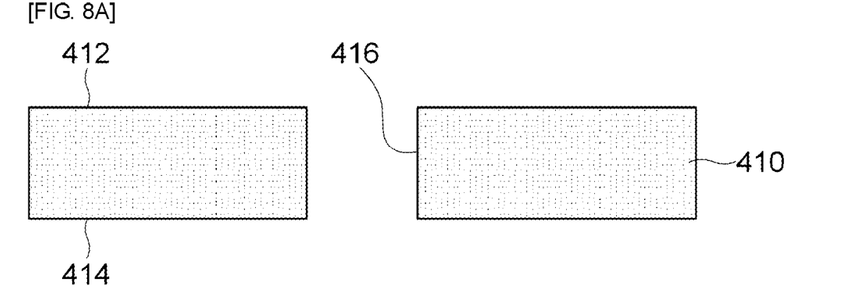
FIGS. 8A to 8D are views for explaining a process of manufacturing the radiant heat substrate in accordance the other embodiment of the present invention, respectively.

Referring to FIG. 8A, there may be prepared a conductive substrate 410 which includes the front surface 412 and the rear surface 414 opposed to the front surface 412. As for the conductive substrate 410, an Al substrate may be prepared.

The through hole 416 may be formed on a region where the luminous element of the conductive substrate 410 is mounted. The step of forming the through hole 416 may include a step of forming the Plating Through Hole (PHT) at the mounting region of the luminous element (indicated by reference numeral 10 of FIG. 7) of the conductive substrate 410. The plating through hole may be formed by a laser processing process or a drilling processing process.

Figure 8B:
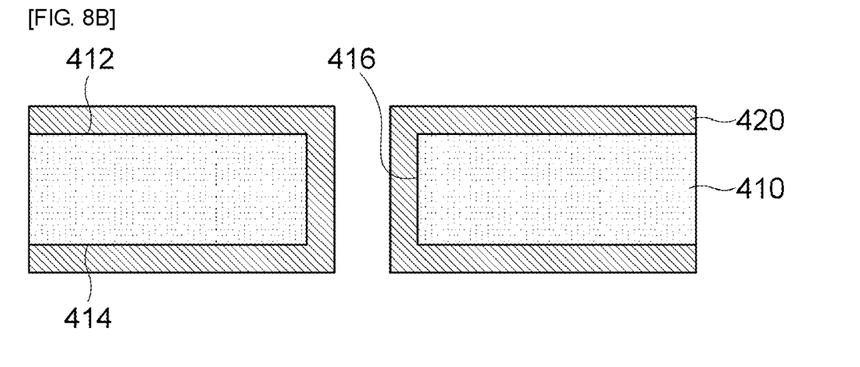

Referring to FIG. 8B, the protective film 420 may be formed on the conductive substrate 410. The step of forming the conductive substrate 420 may include a step of forming a metal oxide film which covers the front surface 412, the rear surface 414, and the through hole 416 of the conductive substrate 410 in a conformal way by anodizing the conductive substrate 410. In case where the conductive substrate 410 is an Al substrate, the $Al_2O_3$ layer may be formed on the conductive substrate 410.

Figure 8C:
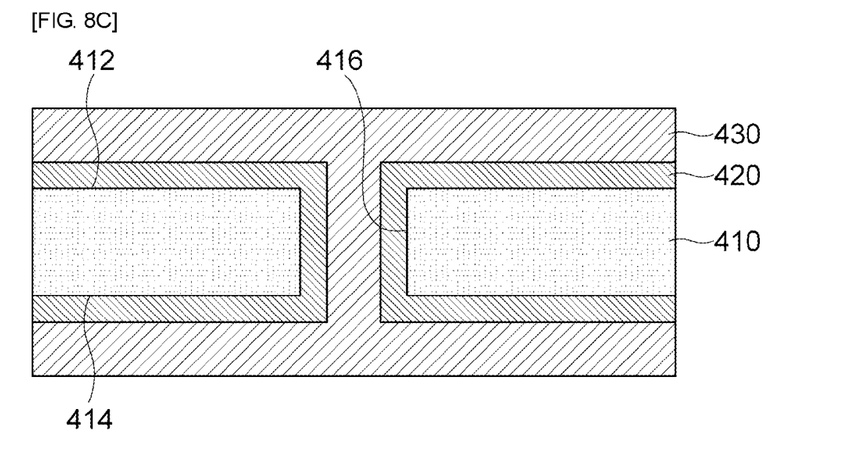

Referring to FIG. 8C, there may be formed on the metal film 430 on the conductive substrate 410. For example, the step of forming the metal film 430 may include a step of forming a copper layer on the conductive substrate 410. The step of forming the copper layer may include a step of forming the seed layer on the conductive substrate 410, and the step of performing a plating process where the seed layer is used as a seed. Thus, there may be formed a metal film 430 which fills the surfaces of the front surface 412 and the rear surface 414 of the conductive substrate 410, and the through hole 416. Thus, the heat transfer via 434 may be formed on the through hole 416 of the conductive substrate 410.

Figure 8D:
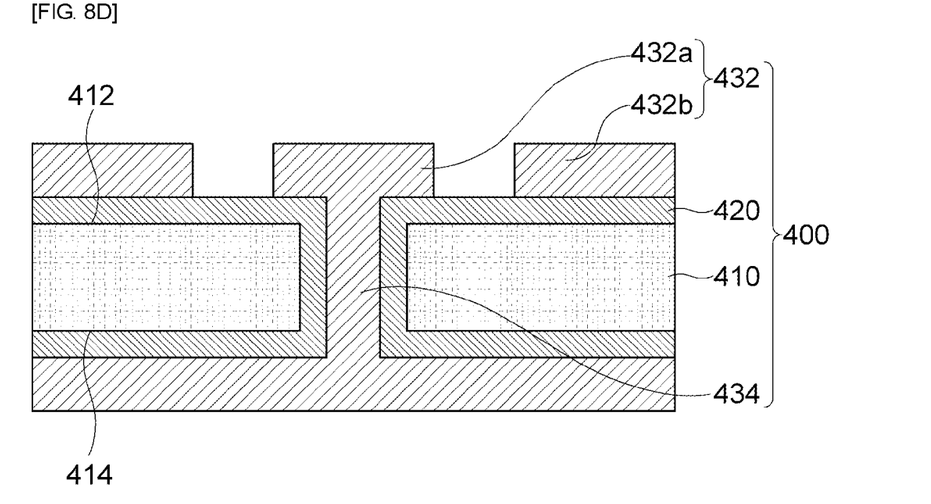

Referring to FIG. 8D, there may be formed a metal pattern 432 on the conductive substrate 410. The step of forming the metal pattern 432 may include a step of partially removing the metal film (indicated by reference numeral 430 of FIG. 8C). The step of partially removing the metal film 430 may be performed by performing various types of etching and laser-processing processes for the metal film 430 which covers the front surface 412 of the conductive substrate 410. Thus, the first pattern 442a and the second pattern 442b may be formed on the front surface 412 of the conductive substrate 410. Thus, the radiant heat substrate 400 shown in FIG. 7 may be manufactured.

Meanwhile, after the radiant heat substrate 400 is manufactured in this manner, the luminous element 10 is mounted on the first pattern 442a of the metal pattern 442 and the luminous element 10 with the first pattern 442a is electrically connected to the second pattern 442b, so that the luminous element package 4 shown in FIG. 7 may be manufactured.

As described above, the method for manufacturing the radiant heat substrate in accordance with the other embodiment of the present invention may include the steps of forming the first pattern 442a which receives the heat produced from the luminous element 10 on the front surface 412 of the conductive substrate 410, forming the heat transfer via 434 connected to the first pattern 442a in the conductive substrate 410, and forming the protective film 420 which protects leakage currents from the conductive substrate 410 to the external metal chassis (not shown) on the front surface 412 and the rear surface 414. Thus, in the method for manufacturing the radiant heat substrate in accordance with the other embodiment of the present invention, it is possible to provide the radiant heat substrate with a structure for implementing high radiation efficiency, as well as for preventing the electrical characteristics from being lowered.

Hereinafter, a detailed description will be given of a modified example of the radiant heat substrate illustrated with reference to FIG. 7. Herein, the repeated descriptions of the radiant heat substrate 400 and the semiconductor package 4 with the radiant heat substrate 400 will be omitted or simplified.

Figure 9:
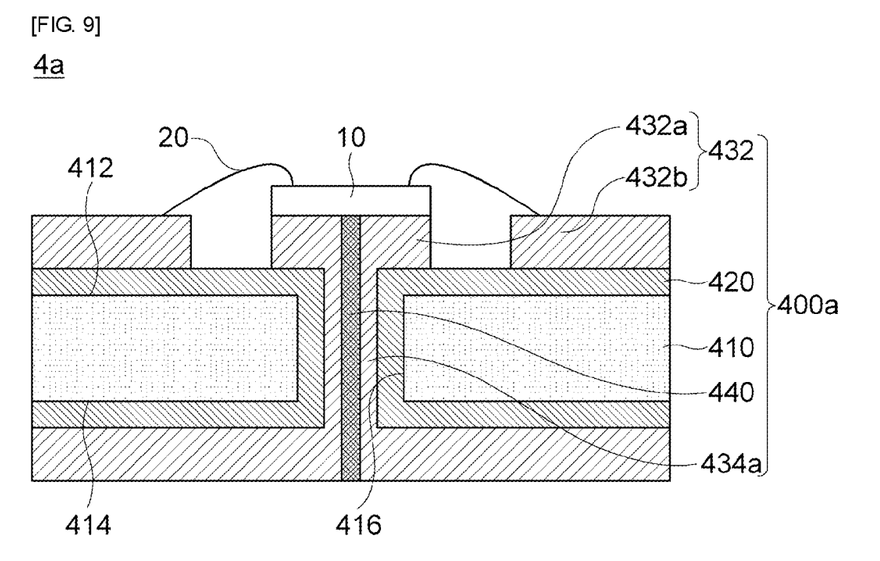
FIG. 9 is a view showing a modified example of the radiant heat substrate shown in FIG. 7.

FIG. 9 is a view showing a modified example of the radiant heat substrate shown in FIG. 7. Referring to FIG. 9, the luminous element package 4a according to the modified example of the other embodiment of the present invention may include luminous element 10 and the radiant heat substrate 400a which are bonded to each other. The luminous element 10 may be electrically connected to the radiant heat substrate 400a by the electrical connection means 20 like a bonding wire.

The radiant heat substrate 400a may include a conductive substrate 410, a protective film 420, a metal pattern 432, and a heat transfer via 434a, and a filler 440.

The conductive substrate 410 may be a metal substrate which includes a front surface 412, and a rear surface 414 opposed to the front surface 412. The conductive substrate 410 may be provided with the through hole 416 formed on a region where the luminous element 10 is mounted. The through hole 416 may be a Plating Through Hole (PTH) which vertically passes through the front surface 412 and the rear surface 414.

The protective film 420 may be formed to cover the surface of the conductive substrate 410. The protective film 420 may be a metal oxide film formed by anodizing the conductive substrate 410.

The metal pattern 432 may be formed to cover the front surface 412 and the rear surface 414 of the conductive substrate 410. For example, the metal pattern 432 covering the front surface 412 may be constituted by the first pattern 432a and the second pattern 432b. Also, the metal pattern 432 may be formed to further cover the rear surface 414 of the conductive substrate 410 at a uniform thickness. The metal pattern 432 with the above-described structure may be formed of a copper layer.

The heat transfer via 434a may be formed to fill a part of the through hole 416 of the conductive substrate 410. For example, the heat transfer via 434a may be formed to cover the surface of the through hole 416 at a uniform thickness. Thus, the heat transfer via 434a may have a hollow structure inside the through hole 416. In addition, the heat transfer via 434a has one end which is connected to the first pattern 432a, and the other end which is connected to the metal pattern 432 covering the rear surface 414. The heat transfer via 434a may be provided as a conductive via including a copper. In this case, the heat transfer via 434a may be used as a radiation means for emitting the heat produced from the luminous element 10 to the outside, together with the metal pattern 432.

And, the filler 440 may be provided to fill the inner space of the heat transfer via 434a. In more particular, the heat transfer via 434a may be formed by the plating process. In this case, since the heat transfer via 434a may be grown from the surface of the through hole 416, the central portion of the through hole 416 may be unfilled by the plating film. Thus, the filler 440 may be provided to fill the inner space of the through hole 416 which is not filled by the heat transfer via 434a. The filler 440 may be an insulating material. For one example, the filler 440 may be formed by filling the unfilled inner space of the through hole 416 with an epoxy resin composition, followed by performing the plating process for formation of the heat transfer via 434a.

A radiant heat substrate and a luminous element package having the radiant heat substrate according to the present invention may have a structure where heat produced from the luminous element is transferred to the conductive substrate, formed of a metal material with high heat conductivity, by a heat transfer pad and the transferred heat is emitted to the outside. Thus, the radiant heat substrate and the luminous element package with the same may have a structure for increasing radiation efficiency.

A radiant heat substrate and a luminous element package having the radiant heat substrate according to the present invention may have a structure made by forming a conductive substrate of a metal material with high heat conductivity and covering the conductive substrate by a metal oxide film to prevent leakage currents. Thus, it is possible to implement a structure for preventing deterioration of electrical characteristics due to the leakage currents.

In a method for manufacturing a radiant heat substrate, it is possible to manufacture a radiant heat substrate with a structure where the heat produced from the luminous element is transferred to the conductive substrate, formed of a metal material with high heat conductivity, by a heat transfer pad and the transferred heat is emitted to the outside. Thus, it is possible to manufacture the radiant heat substrate structured to increase radiation efficiency.

In a method for manufacturing a radiant heat substrate, it is possible to manufacture a radiant heat substrate made by forming a conductive substrate of a metal material with high heat conductivity and covering the conductive substrate by a metal oxide film to prevent leakage currents. Thus, it is possible to implement a structure for preventing deterioration of electrical characteristics due to the leakage currents.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A radiant heat substrate, comprising:
    a conductive substrate formed of a metal material and having:
        a front surface on which a luminous element is disposed at a mounting region,
        a rear surface opposite to the front surface, and
        a through hole defined at a region where the luminous element is disposed;
    a metal oxide film which covers the front and rear surfaces of the conductive substrate, and a surface of the through hole of the conductive substrate in a conformal manner;
    a heat transfer via filled in the through hole and interposed between the metal oxide film; and
    a metal pattern which covers the metal oxide film disposed on the front surface of the conductive substrate, wherein:
    the luminous element includes a body and electrical terminals,
    and the metal pattern comprises:
        a heat transfer pad bonded to and in contact with a lower surface of the body of the luminous element; and
        a circuit line disposed at a region except for the mounting region such that the circuit line is disconnected with the heat transfer pad and is electrically connected to the electrical terminals wherein the heat transfer via has a hollow structure, and the radiant heat substrate further includes a filler formed of an epoxy resin and filled in a vacant space inside the heat transfer via.

2. The radiant heat substrate according to claim 1, wherein:
    the metal pattern is disposed to further cover the rear surface of the conductive substrate, and
    the heat transfer via has one end connected only to the heat transfer pad, and the other end connected to the metal pattern disposed on the rear surface.

3. The radiant heat substrate according to claim 1, wherein:
    the metal pattern further covers the rear surface of the conductive substrate, and
    the metal oxide film is an anti-leakage current film for preventing the leakage currents from the conductive substrate to the outside through the metal pattern disposed on the rear surface.

4. The radiant heat substrate according to claim 1, wherein:
    the conductive substrate is formed of an Al material,
    the metal oxide film includes an $Al_2O_3$ layer, and
    the metal pattern is formed of a Cu material.

5. A luminous element package, comprising:
    a luminous element comprising a body and electrical terminals;
    a conductive substrate formed of a metal material and having:
        a front surface on which the luminous element is disposed at a mounting region,
        a rear surface opposite to the front surface, and
        a through hole defined on a region where the luminous element is disposed;
    a metal oxide film which covers the front and rear surfaces of the conductive substrate, and the through hole of the conductive substrate;
    a heat transfer via filled in the through hole and interposed between the metal oxide film; and
    a metal pattern which covers the metal oxide film disposed on the front surface,
    wherein the metal pattern comprises:
        a heat transfer pad bonded to and in contact with a lower surface of the body of the luminous element; and
        a circuit line disposed at a region except for the mounting region such that the circuit line is disconnected with the heat transfer pad and is electrically connected to the electrical terminals of the luminous element the heat transfer via has a hollow structure, and the radiant heat substrate further includes a filler formed of an epoxy resin and filled in a vacant space inside the heat transfer via.

6. The luminous element package according to claim 5, wherein:
    the metal pattern further covers the rear surface of the conductive substrate, and
    the heat transfer via has one end connected only to the heat transfer pad, and the other end connected to the metal pattern formed on the rear surface.

7. The luminous element package according to claim 5, wherein:
    the metal pattern is disposed to further cover the metal oxide film, and
    the metal oxide film is an anti-leakage current film for preventing leakage currents from the conductive substrate to the outside through the metal pattern covering the metal oxide film.

8. The luminous element package according to claim 5, wherein:
    the conductive substrate is formed of an Al material,
    the metal oxide film includes an $Al_2O_3$ layer, and
    the metal pattern is formed of a Cu material.

* * * * *